(12) United States Patent
Tanaka (10) Patent No.: US 11,355,650 B2
(45) Date of Patent: Jun. 7, 2022

(54) SEMICONDUCTOR DEVICE AND DRIVING METHOD THEREOF

(71) Applicant: Mitsubishi Electric Corporation, Tokyo (JP)

(72) Inventor: Kan Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 130 days.

(21) Appl. No.: 16/847,560

(22) Filed: Apr. 13, 2020

(65) Prior Publication Data

US 2020/0373437 A1 Nov. 26, 2020

(30) Foreign Application Priority Data

May 20, 2019 (JP) .............................. JP2019-094325

(51) Int. Cl.
| | |
|---|---|
| *H01L 27/06* | (2006.01) |
| *H01L 29/66* | (2006.01) |
| *H01L 29/78* | (2006.01) |
| *H01L 29/808* | (2006.01) |
| *H01L 29/10* | (2006.01) |
| *H01L 29/08* | (2006.01) |
| *H03K 17/16* | (2006.01) |
| *H01L 29/423* | (2006.01) |
| *H01L 27/098* | (2006.01) |
| *H01L 29/417* | (2006.01) |

(52) U.S. Cl.
CPC .......... *H01L 29/808* (2013.01); *H01L 27/098* (2013.01); *H01L 29/0843* (2013.01); *H01L 29/10* (2013.01); *H01L 29/41725* (2013.01); *H01L 29/42316* (2013.01); *H03K 17/162* (2013.01)

(58) Field of Classification Search
None
See application file for complete search history.

(56) References Cited

U.S. PATENT DOCUMENTS

| | | | | |
|---|---|---|---|---|
| 9,240,402 | B2 * | 1/2016 | Masliah | H03F 1/56 |
| 9,508,869 | B2 * | 11/2016 | Hower | H01L 21/266 |
| 9,947,785 | B2 * | 4/2018 | Han | H01L 29/408 |
| 2004/0065896 | A1 * | 4/2004 | Sakamoto | H01L 29/808 |
| | | | | 257/E29.127 |

FOREIGN PATENT DOCUMENTS

| | | |
|---|---|---|
| JP | H11-501500 A | 2/1999 |
| WO | 97/24794 A2 | 7/1997 |

OTHER PUBLICATIONS

An Office Action issued by the German Patent Office dated Sep. 27, 2021, which corresponds to German Patent Application No. 10 2020 112 511.9 and is related to U.S. Appl. No. 16/847,560 with English language translation.

* cited by examiner

*Primary Examiner* — Kenneth B Wells
(74) *Attorney, Agent, or Firm* — Studebaker & Brackett PC (57) ABSTRACT

A semiconductor device with a reduced tail current is provided. The semiconductor device includes a first junction field effect transistor. The first junction field effect transistor includes a drift layer of a first conductivity type, a first source region of the first conductivity type, a first gate region of a second conductivity type, a first drain region of the first conductivity type, a semiconductor region of the second conductivity type, and a control electrode. The first source region is provided in the semiconductor region. The control electrode is electrically connected to the semiconductor region.

8 Claims, 9 Drawing Sheets

SEMICONDUCTOR DEVICE AND DRIVING METHOD THEREOF

BACKGROUND OF THE INVENTION

Field of the Invention

The present invention relates to a semiconductor device and a driving method thereof.

Description of the Background Art

Japanese National Patent Publication No. 11-501500 (PTL 1) discloses a half-bridge driving circuit which includes a bootstrap capacitor and a junction field effect transistor (JFET). The JFET includes an n-well region, an $n^+$ source region, an $n^+$ drain region, and a $p^+$ gate region. The source region, the drain region, and the gate region are provided in the n-well region. The drain region of the JFET is connected to the bootstrap capacitor.

SUMMARY OF THE INVENTION

In the junction field effect transistor disclosed in PTL 1, a tail current is generated. The present invention has been made in view of the above problem, and an object thereof is to provide a semiconductor device with a reduced tail current and a driving method thereof.

The semiconductor device of the present invention includes a first junction field effect transistor. The first junction field effect transistor includes a drift layer of a first conductivity type, a first source region of the first conductivity type, a first gate region of a second conductivity type different from the first conductivity type, a first drain region of the first conductivity type, and a semiconductor region of the second conductivity type. The first gate region and the first drain region and the semiconductor region are formed in a first main surface of the drift layer, and are spaced from each other. The first source region is formed in the first main surface of the drift layer, and is provided in the semiconductor region. The first gate region is provided between the first source region and the first drain region, and is spaced from a second main surface of the drift layer opposite to the first main surface thereof.

According to a driving method of the semiconductor device of the present invention, when a drain voltage applied to the first drain electrode is smaller than a source voltage applied to the first source electrode, a first control voltage smaller than the drain voltage is applied to the control electrode so as to form a punch-through between the first source region and the drift layer; and when the drain voltage is greater than the source voltage, a second control voltage equal to the source voltage is applied to the control electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described. The same components are denoted by the same reference numerals, and the description thereof will not be repeated.

First Embodiment

Figure 1:
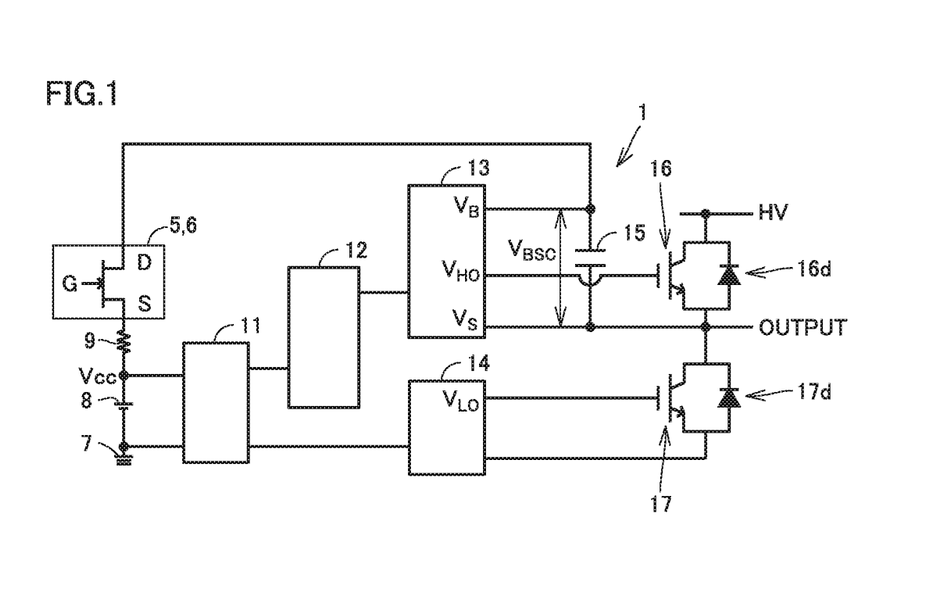
FIG. 1 is a circuit diagram illustrating a driving circuit for a semiconductor switching element, which is an application example of a semiconductor device according to a first embodiment.

Hereinafter, a driving circuit 1 for a switching element (including a high-side switching element 16 and a low-side switching element 17), which is an application example of a semiconductor device 3 according to a first embodiment (see FIGS. 2 to 4) will be described with reference to FIG. 1.

The high-side switching element 16 and the low-side switching element 17 may be connected to each other in a half bridge manner Each of the high-side switching element 16 and the low-side switching element 17 is, for example, an insulated gate bipolar transistor (IGBT) or a metal oxide semiconductor field effect transistor (MOSFET). A diode 16d may be connected in parallel with the high-side switching element 16. A diode 17d may be connected in parallel with the low-side switching element 17.

The driving circuit 1 includes a ground 7 having a ground voltage (0 V), a power supply 8 having a power supply voltage $V_{CC}$, a resistor 9, a junction field effect transistor (including a first junction field effect transistor 5 and a second junction field effect transistor 6), a logic circuit 11, a level shifter 12, a high-side gate driver 13, a low-side gate driver 14, and a bootstrap capacitor 15.

The logic circuit 11 is connected to the ground 7 and the power supply 8, and thereby, the power supply voltage $V_{CC}$ and the ground voltage are supplied to the logic circuit 11. The level shifter 12 and the low-side gate driver 14 are connected to the logic circuit 11. The high-side gate driver 13 is connected to the level shifter 12. The high-side gate driver 13 is provided with a $V_B$ terminal, a $V_S$ terminal, and a $V_{HO}$ terminal. The voltage at the $V_B$ terminal is, for example, a high-side floating power supply absolute voltage $V_B$. The voltage at the $V_S$ terminal is, for example, a high-side floating power supply offset voltage $V_S$. The voltage difference ($V_B$–$V_S$) between the voltage at the $V_B$ terminal and the voltage at the $V_S$ terminal is, for example, a high-side floating power supply voltage. The voltage at the $V_{HO}$ terminal is, for example, a high-side output voltage $V_{HO}$. The low-side gate driver 14 is provided with a $V_{LO}$ terminal. The voltage at the $V_{LO}$ terminal is, for example, a low-side output voltage $V_{LO}$.

A source electrode S (including a first source electrode 32a and a second source electrode 32b) of the junction field effect transistor (including the first junction field effect transistor 5 and the second junction field effect transistor 6) is connected to the power supply 8 via the resistor 9. The power supply voltage $V_{CC}$ is supplied to the source electrode S of the junction field effect transistor (including the first junction field effect transistor 5 and the second junction field effect transistor 6) via the resistor 9.

A drain electrode D (including a first drain electrode 33a and a second drain electrode 33b) of the junction field effect transistor (including the first junction field effect transistor 5 and the second junction field effect transistor 6) is electrically connected to the bootstrap capacitor 15. The bootstrap capacitor 15 is connected to the $V_B$ terminal and the $V_S$ terminal of the high-side gate driver 13. The voltage difference between the $V_B$ terminal and the $V_S$ terminal of the high-side gate driver 13 is the voltage of the bootstrap capacitor 15 (bootstrap voltage $V_{BSC}$). The $V_{HO}$ terminal of the high-side gate driver 13 is connected to the gate electrode of the high-side switching element 16. The high-side output voltage $V_{HO}$ is applied to the gate electrode of the high-side switching element 16.

The $V_{LO}$ terminal of the low-side gate driver 14 is connected to the gate electrode of the low-side switching element 17. The low-side output voltage $V_{LO}$ is applied to the gate electrode of the low-side switching element 17. The low-side gate driver 14 supplies the low-side output voltage $V_{LO}$ to the gate electrode of the low-side switching element 17 to control the low-side switching element 17.

When the low-side switching element 17 is switched to the on state, the junction field effect transistor (including the first junction field effect transistor 5 and the second junction field effect transistor 6) is in the on state, and the bootstrap capacitor 15 is charged. The high-side switching element 16 is in the off state. When the low-side switching element 17 is switched to the off state, the junction field effect transistor (including the first junction field effect transistor 5 and the second junction field effect transistor 6) is in the off state, and the bootstrap capacitor 15 is discharged. The high-side gate driver 13 outputs the high-side output voltage $V_{HO}$ based on the bootstrap voltage $V_{BSC}$. The high-side gate driver 13 supplies the high-side output voltage $V_{HO}$ to the gate electrode of the high-side switching element 16 to operate the gate of the high-side switching element 16. The high-side switching element 16 is in the on state.

The semiconductor device 3 of the present embodiment will be described with reference to FIGS. 2 to 4. The semiconductor device 3 mainly includes the first junction field effect transistor 5. The semiconductor device 3 may further include the second junction field effect transistor 6.

Figure 3:
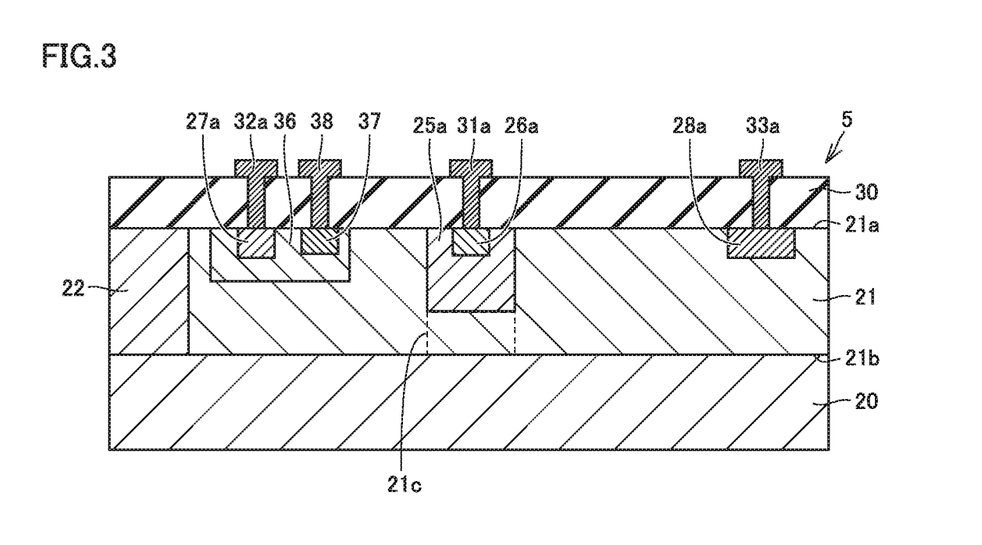
FIG. 3 is a cross-sectional view schematically illustrating a partially enlarged cross section of the semiconductor device according to the first embodiment taken along line III-III illustrated in FIG. 2 or a semiconductor device according to a second embodiment taken along line III-III illustrated in FIG. 15.

As illustrated in FIG. 3, the first junction field effect transistor 5 includes a drift layer 21 of a first conductivity type, a first source region 27a of a first conductivity type, a first gate region 25a of a second conductivity type different from the first conductivity type, a first drain region 28a of the first conductivity type, and a semiconductor region 36 of the second conductivity type. In the present embodiment, the first conductivity type is n-type, and the second conductivity type is p-type. Alternatively, the first conductivity type may be p-type, and the second conductivity type may be n-type. The drift layer 21, the first source region 27a, the first gate region 25a, the first drain region 28a, and the semiconductor region 36 are formed of a semiconductor material such as silicon, gallium nitride, or silicon carbide.

The drift layer 21 may be provided on a semiconductor substrate 20 of the second conductivity type. The expression that the drift layer 21 is provided on the semiconductor substrate 20 means that the drift layer 21 is provided in contact with the semiconductor substrate 20 or that the drift layer 21 is provided above the semiconductor substrate 20. The drift layer 21 has a first main surface 21a and a second main surface 21b opposite to the first main surface 21a. For example, the first main surface 21a may be distal from the semiconductor substrate 20, and the second main surface 21b may be proximal to the semiconductor substrate 20. In a planar view of the first main surface 21a of the drift layer 21, an outer peripheral layer 22 of the second conductivity type is provided on the outer periphery of the drift layer 21. Alternatively, the outer peripheral layer 22 may be provided on the semiconductor substrate 20.

The first drain region 28a is formed in the drift layer 21. The first drain region 28a is formed in the first main surface 21a of the drift layer 21. The first drain region 28a is spaced from the second main surface 21b of the drift layer 21.

The semiconductor region 36 is formed in the drift layer 21. The semiconductor region 36 is formed in the first main surface 21a of the drift layer 21. The semiconductor region 36 is spaced from the second main surface 21b of the drift layer 21.

The first source region 27a is formed in the first main surface 21a of the drift layer 21. The first source region 27a is provided in the semiconductor region 36. The first source region 27a is surrounded by the semiconductor region 36. The first source region 27a is spaced from the second main surface 21b of the drift layer 21.

The first gate region 25a is formed in the drift layer 21. The first gate region 25a is formed in the first main surface 21a of the drift layer 21. The first gate region 25a is provided between the first source region 27a (the semiconductor region 36) and the first drain region 28a.

The first gate region 25a is spaced from the second main surface 21b of the drift layer 21. A channel region 21c of the first conductivity type is formed between the second main surface 21b of the drift layer 21 and the first gate region 25a. The channel region 21c is located between the first source region 27a and the first drain region 28a, and is a part of the drift layer 21 located between the second main surface 21b of the drift layer 21 and the first gate region 25a. The width of the channel region 21c (channel width) is determined by a gap between the second main surface 21b of the drift layer 21 and the first gate region 25a.

The first gate region 25a, the first drain region 28a and the semiconductor region 36 are spaced from each other. The first gate region 25a, the first drain region 28a and the first source region 27a (the semiconductor region 36) are spaced from each other. The first main surface 21a of the drift layer 21 may be provided with an insulating film 30. The insulating film 30 is, for example, a silicon dioxide film or a silicon nitride film.

The first junction field effect transistor 5 further includes a first source electrode 32a, a first gate electrode 31a, a first drain electrode 33a, and a control electrode 38. The first source electrode 32a is electrically connected to the first source region 27a. The first source electrode 32a may penetrate the insulating film 30. The first gate electrode 31a is electrically connected to the first gate region 25a. The first gate electrode 31a may penetrate the insulating film 30 so as to be connected to a first gate contact region 26a of the second conductivity type that is provided in the first gate region 25a. The first drain electrode 33a is electrically connected to the first drain region 28a. The first drain electrode 33a may penetrate the insulating film 30.

The control electrode 38 is electrically connected to the semiconductor region 36. The control electrode 38 may penetrate the insulating film 30 so as to be connected to a contact region 37 of the second conductivity type that is provided in the semiconductor region 36.

Figure 4:
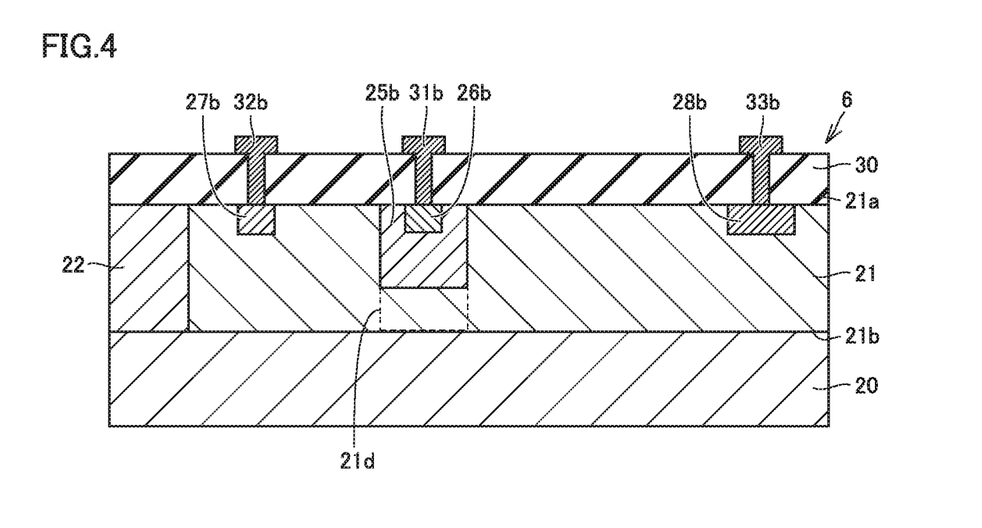
FIG. 4 is a cross-sectional view schematically illustrating a partially enlarged cross section of the semiconductor device according to the first embodiment taken along line III-III illustrated in FIG. 2 or a semiconductor device according to a second embodiment taken along line III-III illustrated in FIG. 15.

As illustrated in FIG. 4, the second junction field effect transistor 6 includes a drift layer 21, a second source region 27b of the first conductivity type, a second gate region 25b of the second conductivity type, and a second drain region 28b of the first conductivity type. The second source region 27b, the second gate region 25b and the second drain region 28b are formed of a semiconductor material such as silicon, gallium nitride, or silicon carbide.

The second drain region 28b is formed in the drift layer 21. The second drain region 28b is formed in the first main surface 21a of the drift layer 21. The second drain region 28b is spaced from the second main surface 21b of the drift layer 21.

The second source region 27b is formed in the drift layer 21. The second source region 27b is formed in the first main surface 21a of the drift layer 21. The second source region 27b is spaced from the second main surface 21b of the drift layer 21.

The second gate region 25b is formed in the drift layer 21. The second gate region 25b is formed in the first main surface 21a of the drift layer 21. The second gate region 25b is provided between the second source region 27b and the second drain region 28b. The second gate region 25b, the second drain region 28b and the second source region 27b are spaced from each other.

The second gate region 25b is spaced from the second main surface 21b of the drift layer 21. A channel region 21d of the first conductivity type is formed between the second main surface 21b of the drift layer 21 and the second gate region 25b. The channel region 21d is located between the second source region 27b and the second drain region 28b, and is a part of the drift layer 21 located between the second main surface 21b of the drift layer 21 and the second gate region 25b. The width of the channel region 21d (channel width) is determined by a gap between the second main surface 21b of the drift layer 21 and the second gate region 25b.

The semiconductor region 36 is selectively provided in the first junction field effect transistor 5 of the first junction field effect transistor 5 and the second junction field effect transistor 6. The semiconductor region 36 is not provided in the second junction field effect transistor 6. The semiconductor region 36 is spaced from the second junction field effect transistor 6. The semiconductor region 36 is spaced from the second source region 27b.

The second junction field effect transistor 6 further includes a second source electrode 32b, a second gate electrode 31b, and a second drain electrode 33b. The second source electrode 32b is electrically connected to the second source region 27b. The second source electrode 32b may penetrate the insulating film 30. The second gate electrode 31b is electrically connected to the second gate region 25b. The second gate electrode 31b may penetrate the insulating film 30 so as to be connected to a second gate contact region 26b of the second conductivity type that is provided in the second gate region 25b. The second drain electrode 33b is electrically connected to the second drain region 28b. The second drain electrode 33b may penetrate the insulating film 30.

The second junction field effect transistor 6 is arranged in parallel to the first junction field effect transistor 5. The semiconductor device 3 may include a plurality of first junction field effect transistors 5 and a plurality of second junction field effect transistors 6. The number of the first junction field effect transistors 5 may be equal to the number of the second junction field effect transistors 6. The number of the first junction field effect transistors 5 may be greater than the number of the second junction field effect transistors 6. The number of the first junction field effect transistors 5 may be less than the number of the second junction field effect transistors 6. The plurality of first junction field effect transistors 5 and the plurality of second junction field effect transistors 6 may be alternately arranged.

Figure 2:
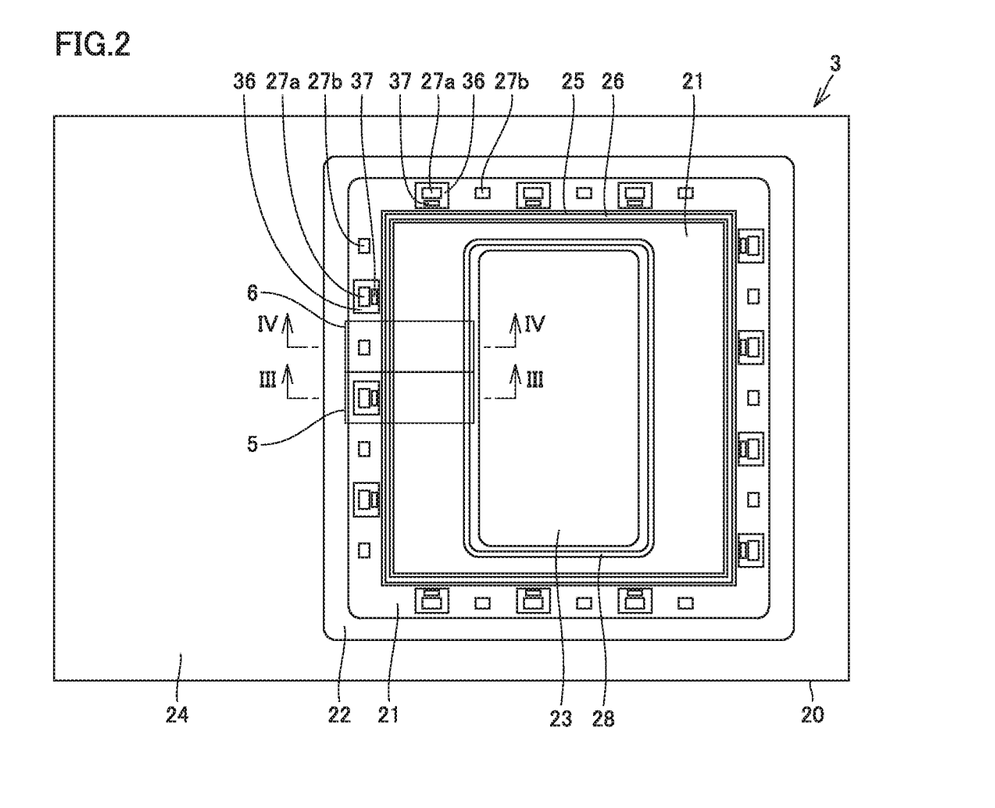
FIG. 2 is a planar view schematically illustrating the semiconductor device according to the first embodiment.

The first gate region 25a and the second gate region 25b are connected to each other to form a gate region 25 (see FIG. 2). The first gate region 25a is a first portion of the gate region 25 included in the first junction field effect transistor 5. The second gate region 25b is a second portion of the gate region 25 included in the second junction field effect transistor 6. In a planar view of the first main surface 21a of the drift layer 21, the gate region 25 partitions the drift layer 21 into a first drift layer portion proximal to the first source region 27a and the second source region 27b, and a second drift layer portion proximal to the first drain region 28a and the second drain region 28b. In the planar view of the first main surface 21a of the drift layer 21, the gate region 25 may have a closed loop shape.

The first gate contact region 26a and the second gate contact region 26b are connected to each other to form a gate contact region 26 (see FIG. 2). The first gate contact region 26a is a first portion of the gate contact region 26 included in the first junction field effect transistor 5. The second gate region 25b is a second portion of the gate contact region 26 included in the second junction field effect transistor 6. In the planar view of the first main surface 21a of the drift layer 21, the gate contact region 26 partitions the drift layer 21 into a first drift layer portion proximal to the first source region 27a and the second source region 27b, and a second drift layer portion adjacent to the first drain region 28a and the second drain region 28b. In the planar view of the first main surface 21a of the drift layer 21, the gate contact region 26 may have a closed loop shape.

The first drain region 28a and the second drain region 28b are connected to each other to form a drain region 28 (see FIG. 2). The first drain region 28a is a first portion of the drain region 28 included in the first junction field effect transistor 5. The second drain region 28b is a second portion of the drain region 28 included in the second junction field effect transistor 6. In the planar view of the first main surface 21a of the drift layer 21, the drain region 28 may have a closed loop shape. In the planar view of the first main surface 21a of the drift layer 21, the drain region 28 may be disposed inside the gate region 25. In the planar view of the first main surface 21a of the drift layer 21, the first source region 27a, the second source region 27b, the semiconductor region 36 and the contact region 37 may be disposed outside the gate region 25.

As illustrated in FIG. 2, the semiconductor device 3 further includes a high-side region 23 proximal to the first drain region 28a and a low-side region 24 proximal to the first source region 27a. The high-side region 23 includes the high-side gate driver 13 (see FIG. 1). The low-side region 24 includes the low-side gate driver 14 (see FIG. 1).

In the planar view of the first main surface 21a of the drift layer 21, the high-side region 23 may be disposed inside the drain region 28. In the planar view of the first main surface 21a of the drift layer 21, the high-side region 23 may be surrounded by the drain region 28. In the planar view of the first main surface 21a of the drift layer 21, the high-side region 23 may be surrounded by the drift layer 21. In the planar view of the first main surface 21a of the drift layer 21, the high-side region 23 may be surrounded by the gate region 25. In the planar view of the first main surface 21a of the drift layer 21, the low-side region 24 may be disposed outside the drift layer 21.

In the planar view of the first main surface 21a of the drift layer 21, the first junction field effect transistor 5 and the second junction field effect transistor 6 may be disposed between the high-side region 23 and the low-side region 24. In the planar view of the first main surface 21a of the drift layer 21, the high-side region 23 may be disposed inside the first junction field effect transistor 5 and the second junction field effect transistor 6. In the planar view of the first main surface 21a of the drift layer 21, the high-side region 23 may be surrounded by the first junction field effect transistor 5 and the second junction field effect transistor 6. In the planar view of the first main surface 21a of the drift layer 21, the low-side region 24 may be disposed outside the first junction field effect transistor 5 and the second junction field effect transistor 6.

With reference to FIGS. 5 to 14, the driving method and operation of the semiconductor device 3 according to the present embodiment will be described in comparison with a semiconductor device according to a comparative example.

Figure 7:
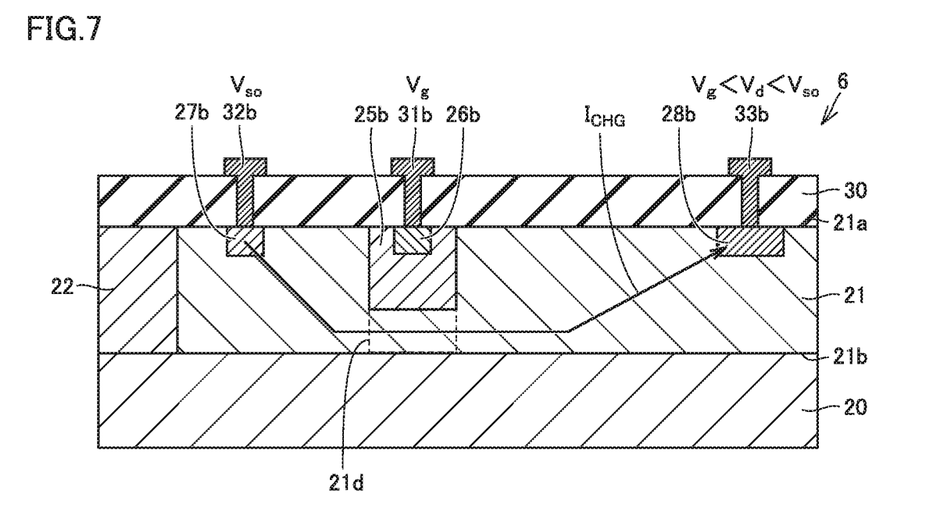
FIG. 7 is a diagram illustrating the operation of a semiconductor device ($V_g < V_d < V_{so}$) according to a comparative example.
Figure 8:
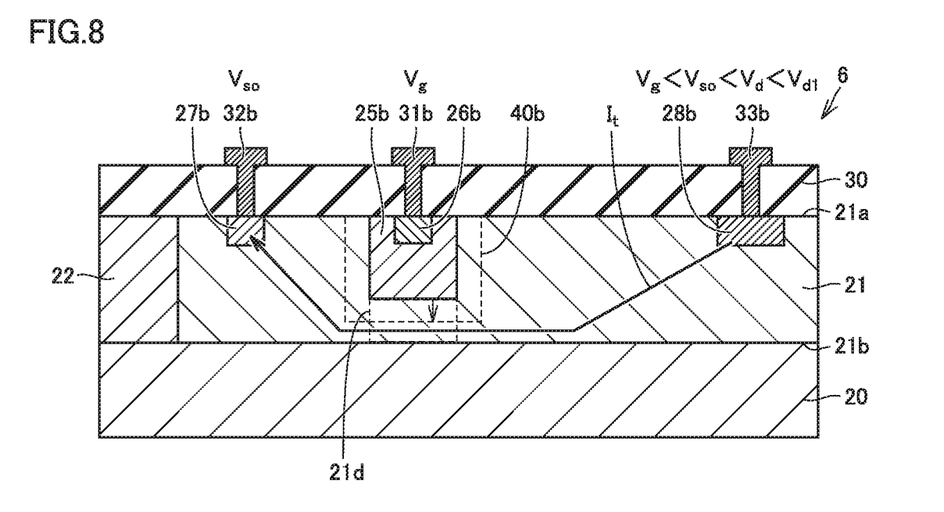
FIG. 8 is a diagram illustrating the operation of a semiconductor device ($V_g < V_{so} < V_d < V_{d1}$) according to a comparative example.
Figure 9:
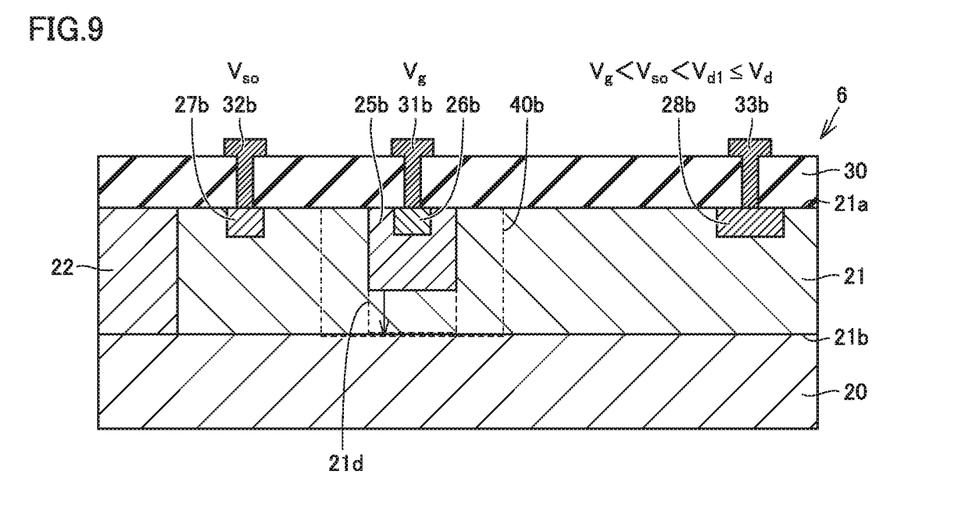
FIG. 9 is a diagram illustrating the operation of a semiconductor device ($V_g < V_{so} < V_{d1} \leq V_d$) according to a comparative example.

As illustrated in FIGS. 7 to 9, the semiconductor device according to the comparative example has the same configuration as the semiconductor device 3 according to the present embodiment but differs in the following points. The semiconductor device according to the comparative example includes only the second junction field effect transistor 6 and does not include the first junction field effect transistor 5. In other words, the semiconductor device according to the comparative example does not include the semiconductor region 36 of the second conductivity type, the contact region 37, and the control electrode 38. In the semiconductor device according to the comparative example, each of the second source region 27b, the second source electrode 32b, the second gate region 25b, the second gate contact region 26b, the second gate electrode 31b, the second drain region 28b, and the second drain electrode 33b has a closed loop shape in the planar view of the first main surface 21a of the drift layer 21.

In the semiconductor device according to the comparative example, as an example, a gate voltage $V_g$ of 0 V is applied to the second gate electrode 31b. A source voltage $V_{so}$ greater than the gate voltage $V_g$ is applied to the second source electrode 32b. A drain voltage $V_d$ greater than the gate voltage $V_g$ is applied to the second drain electrode 33b.

As illustrated in FIG. 7, firstly, a drain voltage $V_d$ smaller than the source voltage $V_{so}$ and greater than the gate voltage $V_g$ is applied to the second drain electrode 33b. Since the source voltage $V_{so}$ is greater than the drain voltage $V_d$, a current I (charging current $I_{CHG}$) flows from the second source region 27b to the second drain region 28b (state A and state B in FIG. 14). The charging current $I_{CHG}$ flows into the bootstrap capacitor 15 electrically connected to the second drain electrode 33b, and thereby, the bootstrap capacitor 15 is charged. As the voltage of the bootstrap capacitor 15 (bootstrap voltage $V_{BSC}$) increases (see FIG. 5), the drain voltage $V_d$ increases accordingly (see FIG. 5).

Figure 5:
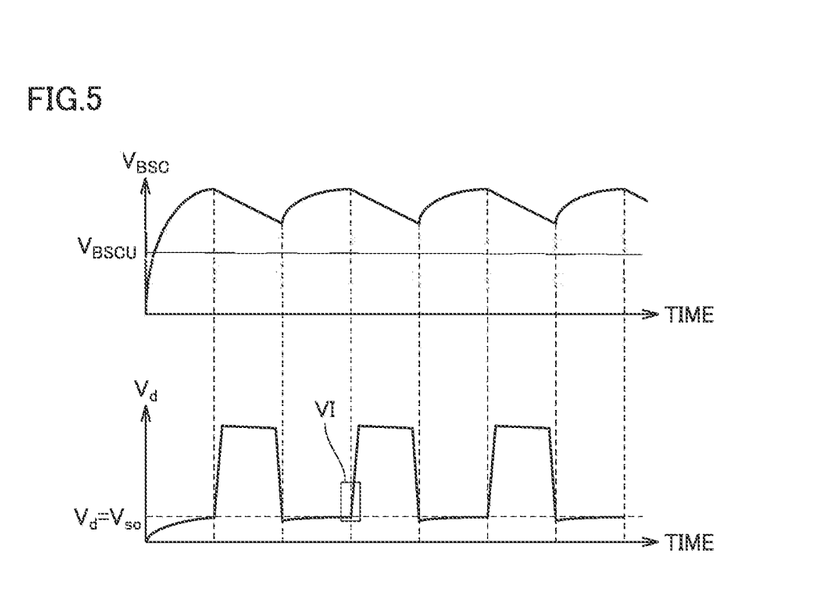
FIG. 5 is a diagram illustrating the waveform of a voltage (bootstrap voltage) of a bootstrap capacitor electrically connected to the semiconductor device according to the first embodiment or to a semiconductor device according to a comparative example, and a diagram illustrating the waveform of a drain voltage $V_d$ of the semiconductor device according to the first embodiment or of a semiconductor device according to a comparative example.

As illustrated in FIG. 5, after the charging of the bootstrap capacitor 15 is completed, when the low-side switching element 17 is switched from the on state to the off state and the high-side switching element 16 is switched from the off state to the on state, the reference voltage of the bootstrap capacitor 15 rapidly increases to the high-side floating power supply offset voltage $V_S$. Therefore, the drain voltage $V_d$ of the drain electrode D (including the first drain electrode 33a and the second drain electrode 33b) of the junction field effect transistor (including the first junction field effect transistor 5 and the second junction field effect transistor 6) electrically connected to the bootstrap capacitor 15 also increases rapidly.

As illustrated in FIG. 9, the drain voltage $V_d$ increases and becomes greater than the source voltage $V_{so}$ and not smaller than $V_{d1}$. A large reverse bias voltage is applied to a p-n junction formed by the drift layer 21 of the first conductivity type and the second gate region 25b of the second conductivity type. A depletion region 40b formed between the drift layer 21 of the first conductivity type and the second gate region 25b of the second conductivity type spreads in the drift layer 21. Since the drain voltage $V_d$ is equal to or greater than $V_{d1}$, the depletion region 40b spreads across the entire width of the channel region 21d. $V_{d1}$ is the drain voltage $V_d$ when the depletion region 40b reaches the second main surface 21b of the drift layer 21. Thus, the flow of the current I between the second source region 27b and the second drain region 28b is interrupted (state D in FIG. 14).

Figure 6:
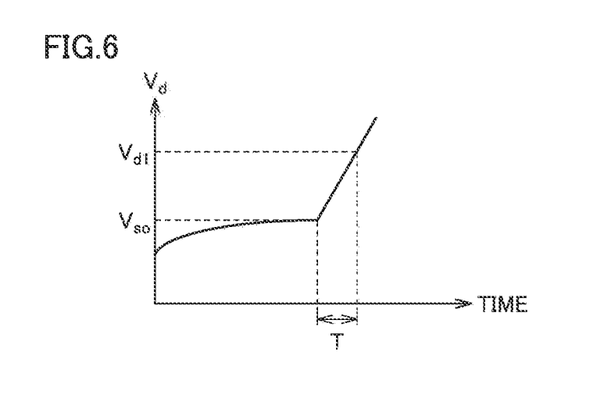
FIG. 6 is a diagram schematically illustrating an enlarged part of the waveform in region VI of FIG. 5.

However, as illustrated in FIG. 8, there exists an interval T (FIG. 6) in which the drain voltage $V_d$ is greater than the source voltage $V_{so}$ and smaller than $V_{d1}$. During this interval T, the depletion region 40b does not reach the second main surface 21b of the drift layer 21. Since the drain voltage $V_d$ is greater than the source voltage $V_{so}$, a current I (tail current $I_t$) flows from the second drain region 28b to the second source region 27b (state C in FIG. 14). In the semiconductor device according to the comparative example, a large switching loss occurs in the interval T (FIG. 6).

On the contrary, in the semiconductor device 3 according to the present embodiment, the number or the area of the second junction field effect transistor 6 is reduced as compared with the comparative example, and is further provided with the first junction field effect transistor 5. As an example, in the semiconductor device 3 according to the present embodiment, a gate voltage $V_g$ of 0 V is applied to the first gate electrode 31a and the second gate electrode 31b. A source voltage $V_{so}$ greater than the gate voltage $V_g$ is applied to the first source electrode 32a and the second source electrode 32b. A drain voltage $V_d$ greater than the gate voltage $V_g$ is applied to the first drain electrode 33a and the second drain electrode 33b. The second junction field effect transistor 6 included in the semiconductor device 3 according to the present embodiment operates in the same manner as the second junction field effect transistor 6 included in the semiconductor device according to the comparative example. However, the first junction field effect transistor 5 included in the semiconductor device 3 according to the present embodiment operates in the manner as described in the following.

Figure 10:
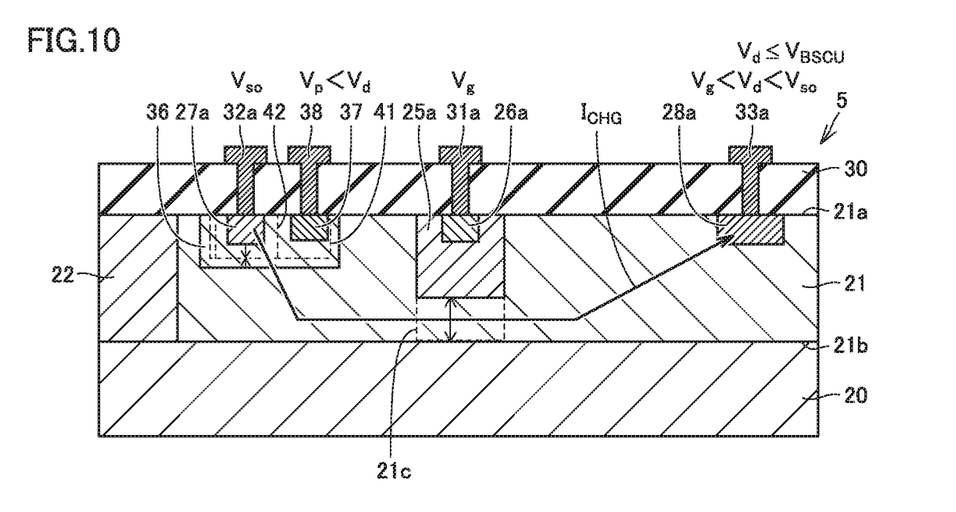
FIG. 10 is a diagram illustrating the operation of a semiconductor device ($V_g < V_d < V_{so}$, $V_d \leq V_{BSCU}$, and $V_p < V_d$) according to the first embodiment.

As illustrated in FIG. 10, firstly, a drain voltage $V_d$ smaller than the source voltage $V_{so}$ and greater than the gate voltage $V_g$ is applied to the first drain electrode 33a. A control voltage $V_p$ smaller than the drain voltage $V_d$ is applied to the control electrode 38. A reverse bias voltage is applied to a p-n junction formed by the drift layer 21 of the first conductivity type and the semiconductor region 36 of the second conductivity type. A depletion region 41 formed between the drift layer 21 of the first conductivity type and the semiconductor region 36 of the second conductivity type spreads in the semiconductor region 36. Further, a reverse bias voltage is applied to a p-n junction formed by the first source region 27a of the first conductivity type and the semiconductor region 36 of the second conductivity type. A depletion region 42 formed between the first source region 27a of the first conductivity type and the semiconductor region 36 of the second conductivity type spreads in the semiconductor region 36.

The depletion region 41 and the depletion region 42 join to each other to form a punch-through between the first source region 27a and the drift layer 21. Therefore, the current I (charging current $I_{CHG}$) flows from the first source region 27a through the channel region 21c into the first drain region 28a (state A in FIG. 14). The charging current $I_{CHG}$ flows into the bootstrap capacitor 15 electrically connected to the first drain electrode 33a, and thereby, the bootstrap capacitor 15 is charged. As the voltage of the bootstrap capacitor 15 (bootstrap voltage $V_{BSC}$) increases (see FIG. 5), the drain voltage $V_d$ also increases (see FIG. 5).

As illustrated in FIG. 5, after the charging of the bootstrap capacitor 15 is completed, the low-side switching element 17 is switched from the on state to the off state and the high-side switching element 16 is switched from the off state to the on state, the reference voltage of the bootstrap capacitor 15 rapidly increases to the high-side floating power supply offset voltage $V_S$. Therefore, the drain voltage $V_d$ of the drain electrode D (including the first drain electrode 33a and the second drain electrode 33b) of the junction field effect transistor (including the first junction field effect transistor 5 and the second junction field effect transistor 6) electrically connected to the bootstrap capacitor 15 also increases rapidly.

Figure 11:
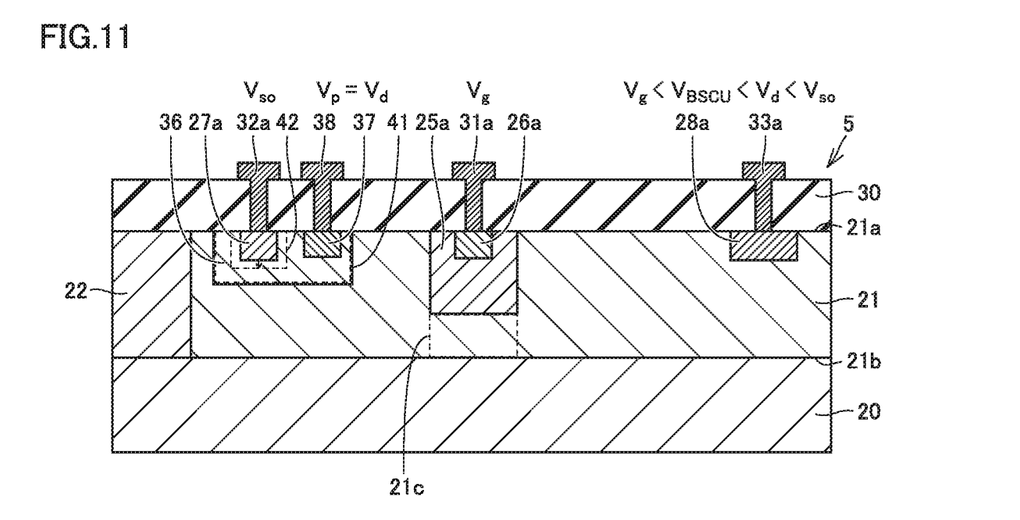
FIG. 11 is a diagram illustrating the operation of a semiconductor device ($V_g < V_{BSCU} < V_d < V_{so}$ and $V_p = V_d$) according to the first embodiment.

As illustrated in FIG. 11, the drain voltage $V_d$ increases and becomes greater than a bootstrap voltage lower limit $V_{BSCU}$ and smaller than the source voltage $V_{so}$. At this time, a control voltage $V_p$ equal to the drain voltage $V_d$ may be applied to the control electrode 38 (state B in FIG. 14). The bootstrap voltage lower limit $V_{BSCU}$ is a lower limit of the voltage (bootstrap voltage $V_{BSC}$) of the bootstrap capacitor 15 that can realize a normal gate operation in the high-side switching element 16 (see FIG. 1). For the following reason, when the drain voltage $V_d$ is smaller than the source voltage $V_{so}$ and greater than the bootstrap voltage lower limit $V_{BSCU}$, the control voltage $V_p$ is changed from smaller than the drain voltage $V_d$ to the drain voltage $V_d$ so as to change the state A (FIGS. 10 and 14) to the state C (FIGS. 12 and 14).

Figure 12:
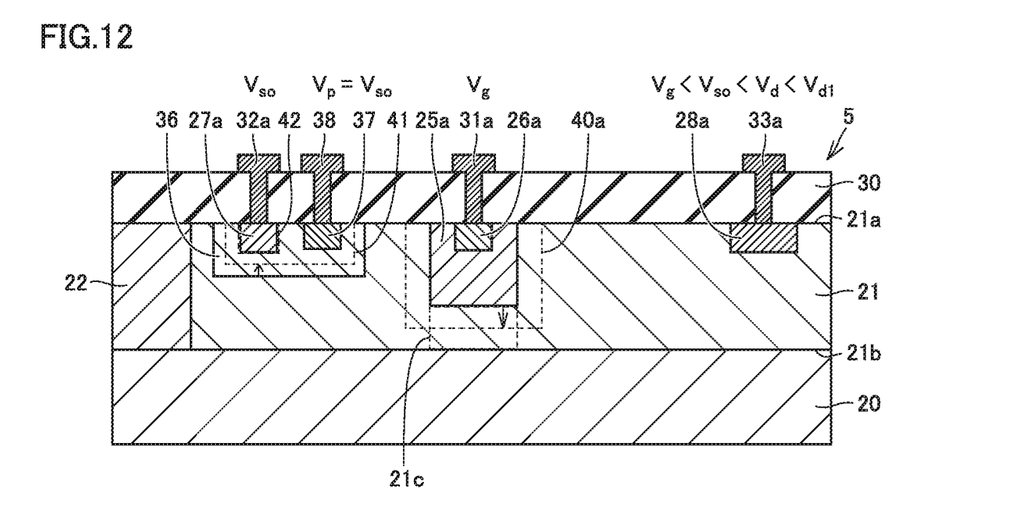
FIG. 12 is a diagram illustrating the operation of a semiconductor device ($V_g < V_{so} < V_d < V_{d1}$, and $V_p = V_{so}$) according to the first embodiment.
Figure 14:
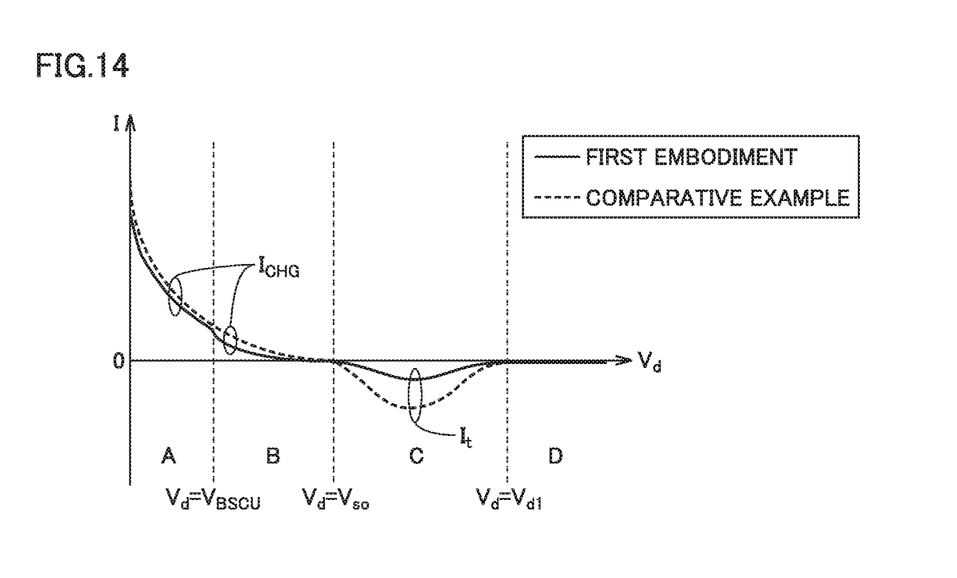
FIG. 14 is a diagram illustrating the relationship between $V_d$ and a current I flowing through semiconductor devices according to the first embodiment and a comparative example.

Since the difference between the control voltage $V_p$ ($<V_d$) in the state A (FIGS. 10 and 14) and the control voltage $V_p$ ($=V_{so}$) in the state C (FIGS. 12 and 14) is large, it will take a longer time to switch the control voltage $V_p$ ($<V_d$) in the state A (FIGS. 10 and 14) directly to the control voltage $V_p$ ($=V_{so}$) in the state C (FIGS. 12 and 14). On the contrary, since the difference between the control voltage $V_p$ ($<V_d$) in the state A (FIGS. 10 and 14) and the control voltage $V_p$ ($=V_d$) in the state B (FIGS. 11 and 14) is smaller, and the difference between the control voltage $V_p$ ($=V_d$) in the state B (FIGS. 11 and 14) and the control voltage $V_p$ ($=V_{so}$) in the state C (FIGS. 12 and 14) is smaller, it is possible to switch the control voltage $V_p$ ($<V_d$) in the state A (FIGS. 10 and 14) to the control voltage $V_p$ ($=V_d$) in the state B (FIGS. 11 and 14) in a shorter time, and it is possible to switch the control voltage $V_p$ ($=V_d$) in the state B (FIGS. 11 and 14) to the control voltage $V_p$ ($=V_{so}$) in the state C (FIGS. 12 and 14) in a shorter time.

For the following reason, when the drain voltage $V_d$ is smaller than the source voltage $V_{so}$ and greater than the bootstrap voltage lower limit $V_{BSCU}$, a control voltage $V_p$ equal to the drain voltage $V_d$ may be applied to the control electrode 38.

Since the control voltage $V_p$ is equal to the drain voltage $V_d$, no reverse bias voltage is applied to the p-n junction formed between the drift layer 21 of the first conductivity type and the semiconductor region 36 of the second conductivity type. The depletion region 41 hardly spreads in the semiconductor region 36. The reverse bias voltage applied to the p-n junction formed between the first source region 27a of the first conductivity type and the semiconductor region 36 of the second conductivity type decreases. The spread of the depletion region 42 in the semiconductor region 36 is smaller than the spread of the depletion region 42 in the state A (see FIGS. 10 and 14). The depletion region 41 and the depletion region 42 are spaced from each other, and thereby, no punch-through is formed between the first source region 27a and the drift layer 21.

A reverse bias voltage is applied to the p-n junction formed between the first source region 27a of the first conductivity type and the semiconductor region 36 of the second conductivity type. Therefore, this p-n junction prevents the current I from flowing between the first source region 27a and the first drain region 28a. The bootstrap voltage $V_{BSC}$ does not increase any further. However, since the drain voltage $V_d$ is greater than the bootstrap voltage lower limit $V_{BSCU}$, the normal gate operation in the high-side switching element 16 (see FIG. 1) can be realized by using the bootstrap voltage $V_{BSC}$ that is greater than the bootstrap voltage lower limit $V_{BSCU}$.

As illustrated in FIG. 12, the drain voltage $V_d$ further increases and becomes greater than the source voltage $V_{so}$ and smaller than $V_{d1}$ (the interval T illustrated in FIG. 6). At this time, the control voltage $V_p$ becomes equal to the source voltage $V_{so}$ (state C in FIG. 14). The reverse bias voltage applied to the p-n junction formed between the drift layer 21 of the first conductivity type and the semiconductor region 36 of the second conductivity type decreases. The spread of the depletion region 41 in the semiconductor region 36 is smaller than the spread of the depletion region 41 in the state A (see FIGS. 10 and 14). No reverse bias voltage is applied to the p-n junction formed between the first source region 27a of the first conductivity type and the semiconductor region 36 of the second conductivity type. The depletion region 42 hardly spreads in the semiconductor region 36. The depletion region 41 and the depletion region 42 are spaced from each other, and thereby, no punch-through is formed between the first source region 27a and the drift layer 21.

A reverse bias voltage is applied to the p-n junction formed between the drift layer 21 of the first conductivity type and the semiconductor region 36 of the second conductivity type. Therefore, the p-n junction prevents the tail current $I_t$ from flowing from the first drain region 28a to the first source region 27a (state C in FIG. 14). Thus, the semiconductor device according to the present embodiment can reduce the switching loss that occurs during the interval T (see FIG. 6).

Figure 13:
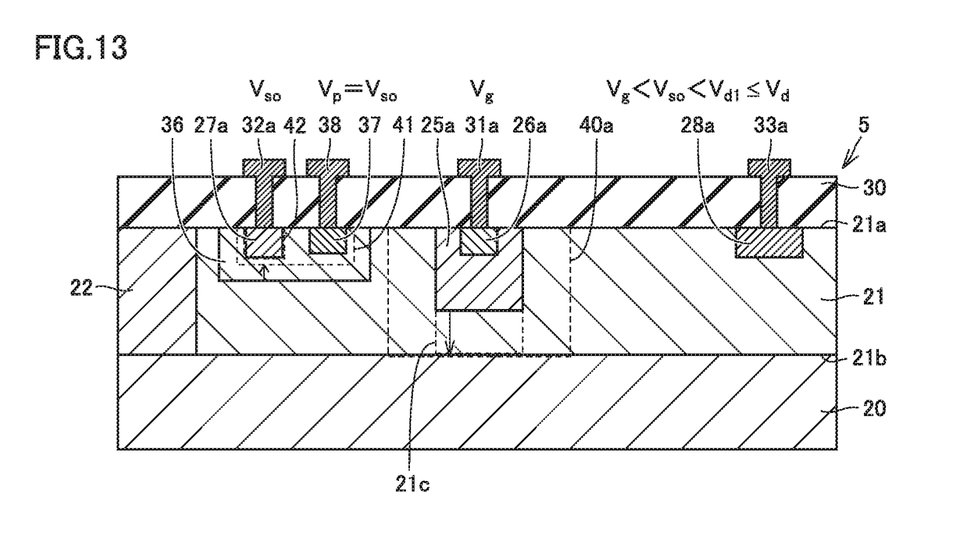
FIG. 13 is a diagram illustrating the operation of a semiconductor device of the first embodiment ($V_g < V_{so} < V_{d1} \leq V_d$, and $V_p = V_{so}$)

As illustrated in FIG. 13, the drain voltage $V_d$ further increases and becomes greater than the source voltage $V_{so}$ and not smaller than $V_{d1}$. A large reverse bias voltage is applied to the p-n junction formed by the drift layer 21 of the first conductivity type and the second gate region 25b of the second conductivity type. A depletion region 40a formed between the drift layer 21 of the first conductivity type and the first gate region 25a of the second conductivity type spreads in the drift layer 21. Since the drain voltage $V_d$ is equal to or greater than $V_{d1}$, the depletion region 40a spreads across the entire width of the channel region 21c. $V_{d1}$ is the drain voltage $V_d$ when the depletion region 40a reaches the second main surface 21b of the drift layer 21. Thus, the flow of the current I between the first source region 27a and the first drain region 28a is interrupted (state D in FIG. 14).

Furthermore, in the state D illustrated in FIGS. 13 and 14, a reverse bias voltage is applied to the p-n junction formed between the drift layer 21 of the first conductivity type and the semiconductor region 36 of the second conductivity type. Therefore, the p-n junction also prevents the current I from flowing between the first source region 27a and the first drain region 28a.

Hereinafter, the effects of the semiconductor device 3 and the driving method thereof according to the present embodiment will be described.

The semiconductor device 3 according to the present embodiment includes a first junction field effect transistor 5. The first junction field effect transistor 5 includes a drift layer 21 of a first conductivity type, a first source region 27a of the first conductivity type, a first gate region 25a of a second conductivity type different from the first conductivity type, a first drain region 28a of the first conductivity type, and a semiconductor region 36 of the second conductivity type. The first junction field effect transistor 5 further includes a first source electrode 32a, a first gate electrode 31a, a first drain electrode 33a, and a control electrode 38. The first source electrode 32a is electrically connected to the first source region 27a. The first gate electrode 31a is electrically connected to the first gate region 25a. The first drain electrode 33a is electrically connected to the first drain region 28a. The control electrode 38 is electrically connected to the semiconductor region 36. The first gate region 25a, the first drain region 28a and the semiconductor region 36 are formed in a first main surface 21a of the drift layer 21, and are spaced from each other. The first source region 27a is formed in the first main surface 21a of the drift layer 21, and is provided in the semiconductor region 36. The first gate region 25a is provided between the first source region 27a and the first drain region 28a, and is spaced from the second main surface 21b of the drift layer 21 opposite to the first main surface 21a thereof.

Even if the drain voltage $V_d$ applied to the first drain electrode 33a is greater than the source voltage $V_{so}$ applied to the first source electrode 32a and smaller than $V_{d1}$, a reverse bias voltage is applied to the p-n junction formed between the drift layer 21 of the first conductivity type and the semiconductor region 36 of the second conductivity type. This p-n junction prevents the tail current $I_t$ from flowing from the first drain region 28a to the first source region 27a during the interval T (FIG. 6) in which the drain voltage $V_d$ is greater than the source voltage $V_{so}$ and smaller than $V_{d1}$. Thus, the semiconductor device 3 can reduce the tail current $I_t$.

The semiconductor device 3 according to the present embodiment further includes a second junction field effect transistor 6 arranged in parallel to the first junction field effect transistor 5. The second junction field effect transistor 6 includes a drift layer 21, a second source region 27b of the first conductivity type, a second gate region 25b of the second conductivity type, and a second drain region 28b of the first conductivity type. The second junction field effect transistor 6 further includes a second source electrode 32b, a second gate electrode 31b, and a second drain electrode 33b. The second source electrode 32b is electrically connected to the second source region 27b. The second gate electrode 31b is electrically connected to the second gate region 25b. The second drain electrode 33b is electrically connected to the second drain region 28b. The second source region 27b, the second gate region 25b and the second drain region 28b are formed in the first main surface 21a of the drift layer 21, and are spaced from each other. The second gate region 25b is provided between the second source region 27b and the second drain region 28b, and is spaced from the second main surface 21b of the drift layer 21. The semiconductor region 36 is selectively provided in the first junction field effect transistor 5 of the first junction field effect transistor 5 and the second junction field effect transistor 6.

Thus, the second junction field effect transistor 6 that does not include the semiconductor region 36 of the second conductivity type is arranged in parallel to the first junction field effect transistor 5. As a result, the on-resistance of the semiconductor device 3 is reduced.

In the semiconductor device 3 according to the present embodiment, the first gate region 25a and the second gate region 25b are connected to each other to form a gate region 25. In a planar view of the first main surface 21a of the drift layer 21, the gate region 25 partitions the drift layer 21 into a first drift layer portion proximal to the first source region 27a and the second source region 27b, and a second drift layer portion proximal to the first drain region 28a and the second drain region 28b. Therefore, the semiconductor device 3 can reduce the tail current $I_t$.

The semiconductor device 3 according to the present embodiment further includes a high-side region 23 proximal to the first drain region 28a and a low-side region 24 proximal to the first source region 27a. The high-side region 23 includes a high-side gate driver 13, and the low-side region 24 includes a low-side gate driver 14. Therefore, the first junction field effect transistor 5 and the high-side gate driver 13 may be compactly integrated in the semiconductor device 3.

The driving method of the semiconductor device 3 according to the present embodiment includes applying a first control voltage (control voltage $V_p$) smaller than the voltage $V_d$ so as to form a punch-through between the first source region 27a and the drift layer 21 when the drain voltage $V_d$ applied to the first drain electrode 33a is smaller than the source voltage $V_{so}$ applied to the first source electrode 32a. The driving method of the semiconductor device 3 according to the present embodiment further includes applying a second control voltage (control voltage $V_p$) equal to the source voltage $V_{so}$ to the control electrode 38 when the drain voltage $V_d$ is greater than the source voltage $V_{so}$.

Even if the drain voltage $V_d$ applied to the first drain electrode 33a is greater than the source voltage $V_{so}$ applied to the first source electrode 32a and smaller than $V_{d1}$, a reverse bias voltage is applied to the p-n junction formed between the drift layer 21 of the first conductivity type and the semiconductor region 36 of the second conductivity type. This p-n junction prevents the tail current $I_t$ from flowing from the first drain region 28a to the first source region 27a during the interval T (FIG. 6) in which the drain voltage $V_d$ is greater than the source voltage $V_{so}$ and smaller than $V_{d1}$. Thus, the driving method of the semiconductor device 3 according to the present embodiment can reduce the tail current $I_t$. Further, when the drain voltage $V_d$ is smaller than the source voltage $V_{so}$, a punch-through is formed between the first source region 27a and the drift layer 21. Therefore, when the drain voltage $V_d$ is smaller than the source voltage $V_{so}$, the driving method of the semiconductor device 3 according to the present embodiment can prevent the current I (charging current $I_{CHG}$) from flowing from the first source region 27a to the first drain region 28a.

The driving method of the semiconductor device 3 according to the present embodiment includes applying a first control voltage (control voltage $V_p$) smaller than the drain voltage $V_d$ to the control electrode 38 so as to form a punch-through between the first source region 27a and the drift layer 21 when the drain voltage $V_d$ applied to the first drain electrode 33a is smaller than the source voltage $V_{so}$ applied to the first source electrode 32a and not greater than the bootstrap voltage lower limit $V_{BSCU}$. The driving method of the semiconductor device 3 according to the present embodiment further includes applying a third control voltage (control voltage $V_p$) equal to the drain voltage $V_d$ to the control electrode 38 when the drain voltage $V_d$ is smaller than the source voltage $V_{so}$ and greater than the bootstrap voltage lower limit $V_{BSCU}$. The driving method of the semiconductor device 3 according to the present embodiment further includes applying a second control voltage (control voltage $V_p$) equal to the source voltage $V_{so}$ to the control electrode 38 when the drain voltage $V_d$ is greater than the source voltage $V_{so}$. The high-side gate driver 13 is electrically connected to the bootstrap capacitor 15 and the high-side switching element 16 (see FIG. 1). The bootstrap capacitor 15 is electrically connected to the first drain electrode 33a. The bootstrap voltage lower limit $V_{BSCU}$ is a lower limit of the voltage of the bootstrap capacitor 15 that can realize a normal gate operation in the high-side switching element 16 (see FIG. 1).

Therefore, the tail current $I_t$ is prevented from flowing from the first drain region 28a to the first source region 27a during the interval T (FIG. 6) in which the drain voltage $V_d$ is greater than the source voltage $V_{so}$ and smaller than $V_{d1}$. Thus, the driving method of the semiconductor device 3 according to the present embodiment can reduce the tail current $I_t$. When the drain voltage $V_d$ is smaller than the source voltage $V_{so}$ and not greater than the bootstrap voltage lower limit $V_{BSCU}$, the driving method of the semiconductor device 3 according to the present embodiment allows the current I (charging current $I_{CHG}$) to flow from the first source region 27a to the first drain region 28a. Furthermore, the driving method of the semiconductor device 3 according to the present embodiment can switch the control voltage $V_p$ applied to the control electrode 38 from the first control voltage smaller than the drain voltage $V_d$ to the source voltage $V_{so}$ in a shorter time. According to the driving method of the semiconductor device 3 according to the present embodiment, the semiconductor device 3 may be driven in a shorter time and may operate at a higher frequency.

Second Embodiment

Hereinafter, a semiconductor device 3b according to a second embodiment will be described with reference to FIGS. 15 to 18. The semiconductor device 3b according to the present embodiment mainly includes a first junction field effect transistor 5b and a second junction field effect transistor 6b. The first junction field effect transistor 5b and the second junction field effect transistor 6b according to the present embodiment have the same configuration as the first junction field effect transistor 5 and the second junction field effect transistor 6 according to the first embodiment but differ mainly in the following points.

Figure 15:
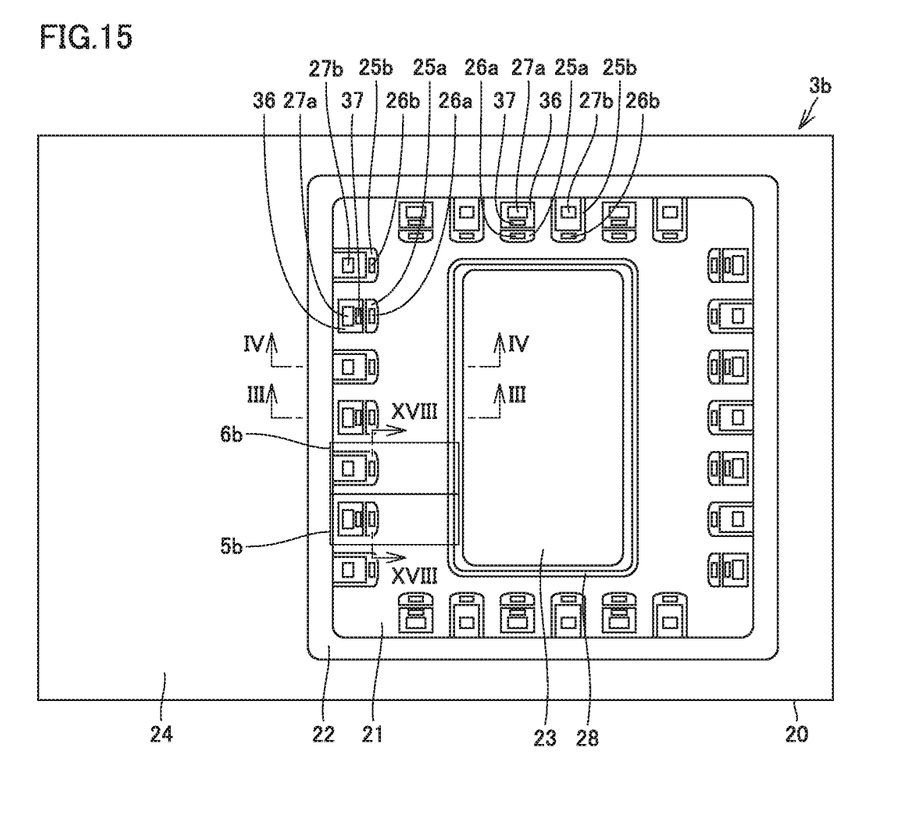
FIG. 15 is a planar view schematically illustrating a semiconductor device according to a second embodiment.
Figure 16:
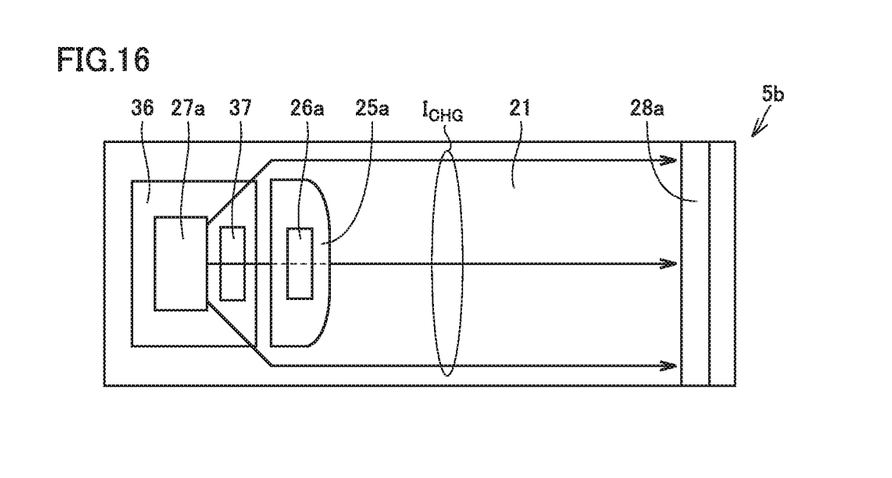
FIG. 16 is a partially enlarged planar view schematically illustrating a first junction field effect transistor included in the semiconductor device according to the second embodiment.

As illustrated in FIG. 15, in the first junction field effect transistor 5b and the second junction field effect transistor 6b, the first gate region 25a and the second gate region 25b are spaced from each other by the drift layer 21. As illustrated in FIG. 16, the current I (charging current $I_{CHG}$) that flows from the first drain region 28a to the first source region 27a passes through only the drift layer 21 located below the first gate region 25a but also the drift layer 21 located between the first gate region 25a and the second gate region 25b. Therefore, the on-resistance of the semiconductor device 3b (the first junction field effect transistor 5b) is reduced.

Figure 17:
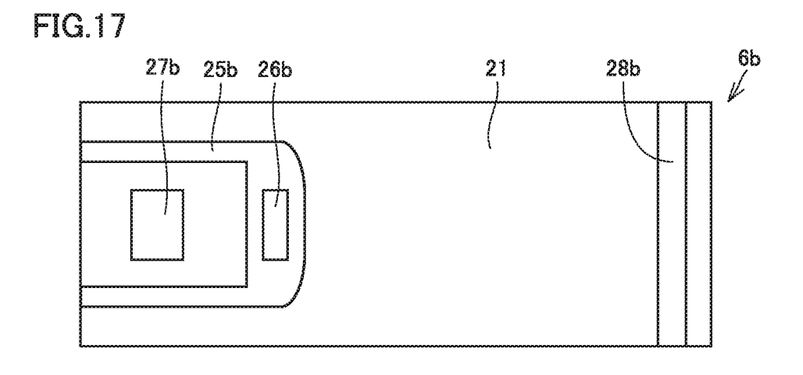
FIG. 17 is a partially enlarged planar view schematically illustrating a second junction field effect transistor included in the semiconductor device according to the second embodiment.

As illustrated in FIGS. 15 and 17, in the planar view of the first main surface 21a of the drift layer 21, the second gate region 25b surrounds the second source region 27b. When the second gate region 25b extends to the outer edge of the drift layer 21, the second gate region 25b surrounds at least three sides of the second source region 27b. When the second gate region 25b does not extend to the outer edge of the drift layer 21, the second gate region 25b surrounds the four sides of the second source region 27b. Therefore, when the drain voltage $V_d$ is equal to or greater than $V_{d1}$, the flow of the current I between the second source region 27b and the drain region 28 (including the first drain region 28a and the second drain region 28b) is interrupted.

When the drain voltage $V_d$ is equal to or greater than $V_{d1}$, a reverse bias voltage is applied to the p-n junction formed between the drift layer 21 of the first conductivity type and the semiconductor region 36 of the second conductivity type. This p-n junction prevents the current I from flowing between the first source region 27a and the first drain region 28a. Thus, the first gate region 25a may not surround the first source region 27a (the semiconductor region 36). In a modification of the present embodiment, the first gate region 25a may surround the first source region 27a (the semiconductor region 36).

Figure 18:
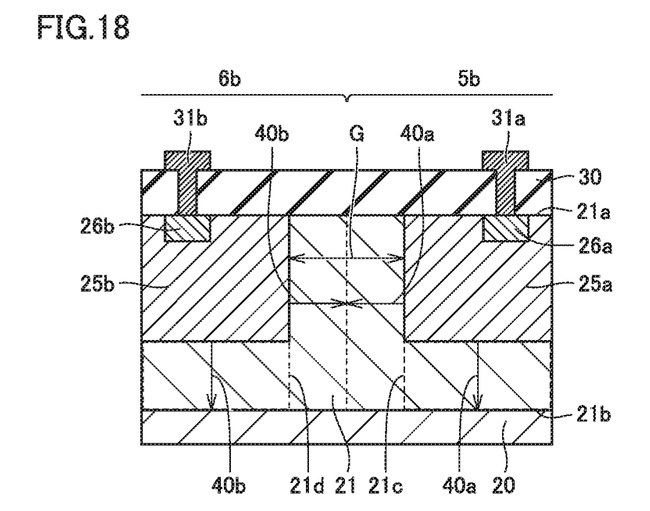
FIG. 18 is a cross-sectional view schematically illustrating a partially enlarged cross section of the semiconductor device ($V_g < V_{so} < V_{d1} \leq V_d$ and $V_p = V_{so}$) according to the second embodiment taken along line XVIII-XVIII illustrated in FIG. 15.

As illustrated in FIG. 18, a gap G between the first gate region 25a and the second gate region 25b adjacent to each other is less than twice a gap (i.e., the width of the channel region 21c) between the second main surface 21b of the drift layer 21 and the first gate region 25a, and is less than twice a gap (i.e., the width of the channel region 21d) between the second main surface 21b of the drift layer 21 and the second gate region 25b. Therefore, when the drain voltage $V_d$ is equal to or greater than $V_{d1}$, the depletion region 40a and the depletion region 40b spread across the entire width of the channel regions 21c and 21d, respectively, and spread across the entire width of the drift layer 21 between the first gate region 25a and the second gate region 25b. Thus, when the drain voltage $V_d$ is equal to or greater than $V_{d1}$, the flow of the current I between the source region (including the first source region 27a and the second source region 27b) and the drain region 28 (including the first drain region 28a and the second drain region 28b) is interrupted.

The driving method of the semiconductor device 3b according to the present embodiment is the same as the driving method of the semiconductor device 3 according to the first embodiment. Thus, the driving method of the semiconductor device 3b according to the present embodiment has the same effect as the driving method of the semiconductor device 3 according to the first embodiment.

Hereinafter, the effect of the semiconductor device 3b according to the present embodiment will be described.

In the semiconductor device 3b according to the present embodiment, the first gate region 25a and the second gate region 25b are spaced from each other. In the planar view of the first main surface 21a of the drift layer 21, the second gate region 25b surrounds the second source region 27b. Therefore, the on-resistance of the semiconductor device 3b (the first junction field effect transistor 5b) is reduced. Thus, when the drain voltage $V_d$ is equal to or greater than $V_{d1}$, the flow of the current I between the second source region 27b and the drain region 28 (including the first drain region 28a and the second drain region 28b) is interrupted.

In the semiconductor device 3b according to the present embodiment, a first gap (the gap G) between the first gate region 25a and the second gate region 25b adjacent to each other is less than twice a second gap (i.e., the width of the channel region 21c) between the second main surface 21b of the drift layer 21 and the first gate region 25a, and is less than twice a third gap (i.e., the width of the channel region 21d) between the second main surface 21b of the drift layer 21 and the second gate region 25b. Therefore, when the drain voltage $V_d$ is equal to or greater than $V_{d1}$, the flow of the current I between the source region (including the first source region 27a and the second source region 27b) and the drain region 28 (including the first drain region 28a and the second drain region 28b) is interrupted.

It should be understood that the embodiments disclosed herein have been presented for the purpose of illustration and description but not limited in all aspects. It is intended that the scope of the present invention is not limited to the description above but defined by the scope of the claims and encompasses all modifications equivalent in meaning and scope to the claims.

What is claimed is:

1. A semiconductor device comprising:
   a first junction field effect transistor,
   the first junction field effect transistor including:
   a drift layer of a first conductivity type;
   a first source region of the first conductivity type;
   a first gate region of a second conductivity type different from the first conductivity type;
   a first drain region of the first conductivity type;
   a semiconductor region of the second conductivity type;
   a first source electrode electrically connected to the first source region;
   a first gate electrode electrically connected to the first gate region;
   a first drain electrode electrically connected to the first drain region; and
   a control electrode electrically connected to the semiconductor region,
   the first gate region and the first drain region and the semiconductor region being formed in a first main surface of the drift layer, and being spaced from each other,
   the first source region being formed in the first main surface of the drift layer, and being provided in the semiconductor region,
   the first gate region being provided between the first source region and the first drain region, and being spaced from a second main surface of the drift layer opposite to the first main surface thereof.

2. The semiconductor device according to claim 1, further comprising:
   a second junction field effect transistor arranged in parallel to the first junction field effect transistor, wherein
   the second junction field effect transistor includes:
   the drift layer;
   a second source region of the first conductivity type;
   a second gate region of the second conductivity type;
   a second drain region of the first conductivity type;
   a second source electrode electrically connected to the second source region;
   a second gate electrode electrically connected to the second gate region; and
   a second drain electrode electrically connected to the second drain region,
   the second source region and the second gate region and the second drain region are formed in the first main surface of the drift layer, and are spaced from each other,
   the second gate region is provided between the second source region and the second drain region, and is spaced from the second main surface of the drift layer,
   the semiconductor region is selectively provided in the first junction field effect transistor of the first junction field effect transistor and the second junction field effect transistor.

3. The semiconductor device according to claim 2, wherein the first gate region and the second gate region are connected to each other to form a gate region, in a planar view of the first main surface of the drift layer, the gate region partitions the drift layer into a first drift layer portion proximal to the first source region and the second source region, and a second drift layer portion proximal to the first drain region and the second drain region.

4. The semiconductor device according to claim 2, wherein the first gate region and the second gate region are spaced from each other, in a planar view of the first main surface of the drift layer, the second gate region surrounds the second source region.

5. The semiconductor device according to claim 4, wherein a first gap between the first gate region and the second gate region adjacent to each other is less than twice a second gap between the second main surface of the drift layer and the first gate region, and is less than twice a third gap between the second main surface of the drift layer and the second gate region.

6. The semiconductor device according to claim 1, further comprising:

a high-side region proximal to the first drain region; and
a low-side region proximal to the first source region,
the high-side region includes a high-side gate driver, and the low-side region includes a low-side gate driver.

7. A driving method of the semiconductor device according to claim 1, comprising:

when a drain voltage applied to the first drain electrode is smaller than a source voltage applied to the first source electrode, applying a first control voltage smaller than the drain voltage to the control electrode so as to form a punch-through between the first source region and the drift layer; and when the drain voltage is greater than the source voltage, applying a second control voltage equal to the source voltage to the control electrode.

8. A driving method of the semiconductor device according to claim 6, comprising:

when a drain voltage applied to the first drain electrode is smaller than a source voltage applied to the first source electrode and not greater than a bootstrap voltage lower limit, applying a first control voltage smaller than the drain voltage to the control electrode so as to form a punch-through between the first source region and the drift layer;

when the drain voltage is smaller than the source voltage and greater than the bootstrap voltage lower limit, applying a third control voltage equal to the drain voltage to the control electrode; and when the drain voltage is greater than the source voltage, applying a second control voltage equal to the source voltage to the control electrode, the high-side gate driver being electrically connected to a bootstrap capacitor and a high-side switching element, the bootstrap capacitor being electrically connected to the first drain electrode, and the bootstrap voltage lower limit being a lower limit of a voltage of the bootstrap capacitor capable of realizing a normal gate operation in the high-side switching element.

* * * * *